US007808329B2

(12) United States Patent
Azadet et al.

(10) Patent No.: US 7,808,329 B2
(45) Date of Patent: Oct. 5, 2010

(54) METHODS AND APPARATUS FOR IMPROVED PHASE LINEARITY IN A MULTI-PHASE BASED CLOCK/TIMING RECOVERY SYSTEM

(75) Inventors: Kameran Azadet, Morganville, Monmouth County, NJ (US); Fuji Yang, Holmdel, Monmouth County, NJ (US)

(73) Assignee: Agere Systems Inc., Allentown, PA (US)

( * ) Notice: Subject to any disclaimer, the term of this patent is extended or adjusted under 35 U.S.C. 154(b) by 71 days.

(21) Appl. No.: 12/187,701

(22) Filed: Aug. 7, 2008

(65) Prior Publication Data
US 2010/0034333 A1 Feb. 11, 2010

(51) Int. Cl.
*H03K 3/03* (2006.01)
*H03B 27/00* (2006.01)

(52) U.S. Cl. .............................. 331/57; 331/45; 331/74; 327/258; 327/361

(58) Field of Classification Search .................... 331/45, 331/57, 60, 74; 327/258, 259, 361
See application file for complete search history.

(56) References Cited

U.S. PATENT DOCUMENTS

| | | | | |
|---|---|---|---|---|
| 7,528,668 B2 * | 5/2009 | Kim et al. ..................... 331/45 |
| 7,577,225 B2 * | 8/2009 | Azadet et al. ................ 375/373 |
| 7,602,257 B2 * | 10/2009 | Schrom et al. ................. 331/57 |
| 2008/0231376 A1 * | 9/2008 | Kinoshita et al. .............. 331/34 |
| 2009/0215423 A1 * | 8/2009 | Hwang et al. ................ 455/334 |

OTHER PUBLICATIONS

Bult et al., "An Embedded 240-mW 10-b 50-MS/s CMOS ADC in 1-mm2," IEEE Journal of Solid-State Circuits, vol. 32, No. 12, pp. 1887-1895 (Dec. 12, 1997).
Chou et al., "Phase Averaging and Interpolation Using Resistor Strings or Resistor Rings for Multi-Phase Clock Generation," IEEE Transactions on Circuits and Systems—I, Regular Papers, vol. 53, No. 5, pp. 984-991 (May 5, 2006).

* cited by examiner

*Primary Examiner*—Robert Pascal
*Assistant Examiner*—Levi Gannon
(74) *Attorney, Agent, or Firm*—Ryan, Mason & Lewis, LLP (57) ABSTRACT

Methods and apparatus are provided for improved phase linearity in a multi-phase based clock/timing recovery system. Averaging and interpolation techniques improve phase linearity in a multi-phase clock system. A multi-phase output clock is generated in accordance with one aspect of the invention by generating a plurality of clocks each having a substantially similar frequency and a different phase; applying each of the plurality of clocks to at least one corresponding amplifier such as a differential pair circuit; and summing an output of the corresponding amplifiers to generate the multi-phase output clock. A multiple-stage averaging operation can provide further linearity improvements.

20 Claims, 7 Drawing Sheets

METHODS AND APPARATUS FOR IMPROVED PHASE LINEARITY IN A MULTI-PHASE BASED CLOCK/TIMING RECOVERY SYSTEM

FIELD OF THE INVENTION

The present invention relates generally to multi-phase clock generation techniques for digital communications, and more particularly, to techniques for improving the phase linearity in a multi-phase clock generation system.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases, often referred to as multi-phase clocks. In one typical implementation, the different clock signals are generated by applying the reference clock signal to a delay network. Thereafter, one or more of the clock signals are compared to the phase and frequency of an incoming data stream and one or more of the clock signals are selected for data recovery.

Figure 1:
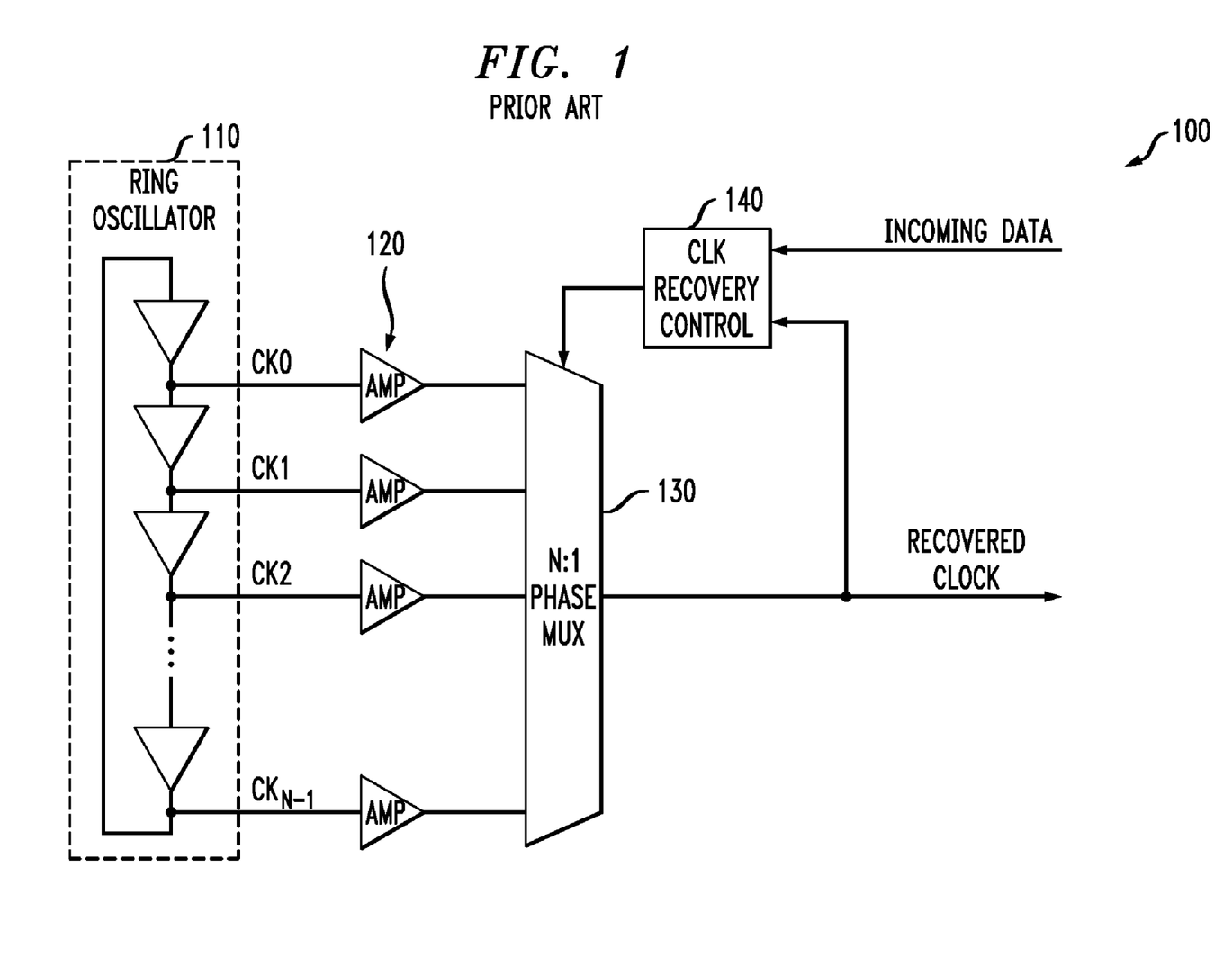
FIG. 1 is a block diagram of a conventional multiple phase-based clock/timing recovery system.

FIG. 1 is a block diagram of a conventional multiple phase-based clock/timing recovery system 100. As shown in FIG. 1, a ring oscillator 110 comprised of a cascaded chain of delay elements generates a multi-phase clock. The multi-phase clock is comprised of a number of different clock signals $CK_0$-$CK_{N-1}$ having the same frequency but with different phases. The multi-phase clock is then applied to a corresponding amplifier 120 before being applied to a phase selection multiplexer 130. A clock recovery loop 140 generates a phase selection control that is applied to the phase selection multiplexer 130. The phase selection multiplexer 130 then selects one of the clocks $CK_0$-$CK_{N-1}$ that is phase-aligned with the incoming data.

The system 100 requires that the multi-phase clocks demonstrate good phase linearity. If a ring oscillator comprised of a cascade of delay cells is used to generate the multi-phase clocks, the phase linearity (i.e., phase step between adjacent phases) is determined by the matching properties of the delay cells. Large devices are generally required to improve the matching, which consume a large area and a significant amount of power. Furthermore, the post-amplifier 120 and phase selector 130 add more phase nonlinearity. In addition, the multi-phase clocks are often generated using a higher frequency clock and then deriving the required phases by dividing down the high frequency clock. The high frequency oscillator will consume a significant amount of power.

A need therefore exists for methods and apparatus that improve the phase linearity in a multi-phase based clock recovery system.

SUMMARY OF THE INVENTION

Generally, methods and apparatus are provided for improved phase linearity in a multi-phase based clock/timing recovery system. According to one aspect of the invention, averaging and interpolation techniques are used to improve phase linearity in a multi-phase clock system. The disclosed averaging and interpolation techniques regenerate the multi-phase clock by averaging a plurality of existing adjacent phase clocks, to thereby reduce the random phase nonlinearity.

A multi-phase output clock is generated in accordance with one aspect of the invention by generating a plurality of clocks each having a substantially similar frequency and a different phase; applying each of the plurality of clocks to at least one corresponding amplifier, such as a differential pair circuit; and summing an output of the corresponding amplifiers to generate the multi-phase output clock. The generating step may be performed, for example, by a ring oscillator. The summing step may be performed, for example, by applying an output of the differential pair circuits to a load. In a further variation, further linearity improvements can be achieved by employing a multiple-stage averaging operation. For example, the multi-phase output clock can be applied to at least a second set of corresponding amplifiers.

A more complete understanding of the present invention, as well as further features and advantages of the present invention, will be obtained by reference to the following detailed description and drawings.

DETAILED DESCRIPTION

The present invention provides methods and apparatus that improve the phase linearity in a multi-phase based clock recovery system. According to one aspect of the invention, averaging and interpolation techniques are used to improve phase linearity in a multi-phase clock system. In one exemplary embodiment, the phase averaging interpolation operation is embedded in the clock amplifier and phase selection circuitry of a multiple phase-based clock/timing recovery system, and thus does not increase the circuit complexity or power requirements. As discussed hereinafter, the disclosed averaging and interpolation techniques regenerate the multi-phase clock by averaging a plurality of existing adjacent phase clocks. The averaging operation reduces the random phase nonlinearity.

Principles of Multi-Phase Clock Generation

For a multi-phase oscillator, oscillating at a frequency, f (i.e., 1/T, where T is the period) the multi-phase output clocks can be expressed as:

$$CK_0 = A^* \sin(\omega t + \phi_0)$$

$$CK_1 = A^* \sin(\omega t + \phi_0)$$

...

$$CK_{N-1} = A^* \sin(\omega t + \phi_{N-1})$$

In an ideal case, the phase difference between adjacent clocks (also referred to as the phase step, $\phi_m - \phi_{m-1}$) is constant and equal to 2π/N. However, in a real world implementation, this phase difference varies and causes phase non-linearity.

The present invention recognizes that the phase linearity can be improved by a phase averaging operation. For example, the averaging operation can be an equal weight interpolation. As an example, if an average is performed on three adjacent clocks, the clock phases after the averaging are:

$$\Phi_{012} = (\phi_0 + \phi_1 + \phi_2)/3$$

$$\Phi_{123} = (\phi_0 + \phi_1 + \phi_2)/3$$

...

$$\Phi_{m-1,m,m+1} = (\phi_{m-1} + \phi_m + \phi_{m+1})/3$$

$$\Phi_{m,m+1,m+2} = (\phi_m + \phi_{m+1} + \phi_{m+2})/3$$

The phase step after averaging is:

$$\Phi_{step} = \Phi_{m,m+1,m+2} - \Phi_{m-1,m,m+1} = (\phi_{m+2} - \phi_{m-1})/3 = (\phi_{m+2} - \phi_{m+1} + \phi_{m+1} - \phi_m + \phi_m - \phi_{m-1})/3 = \Delta + (\sigma_{m+1} + \sigma_m + \sigma_{m-1})/3$$

where Δ is the ideal phase step and $\sigma_m$ is the phase step error between phase (m+1) and phase m. As the total delay is governed by the clock period (which is constant), statistically, the correlation coefficient between σ for different phase steps will be negative. As a result, the averaging reduces the phase step error.

Figure 2:
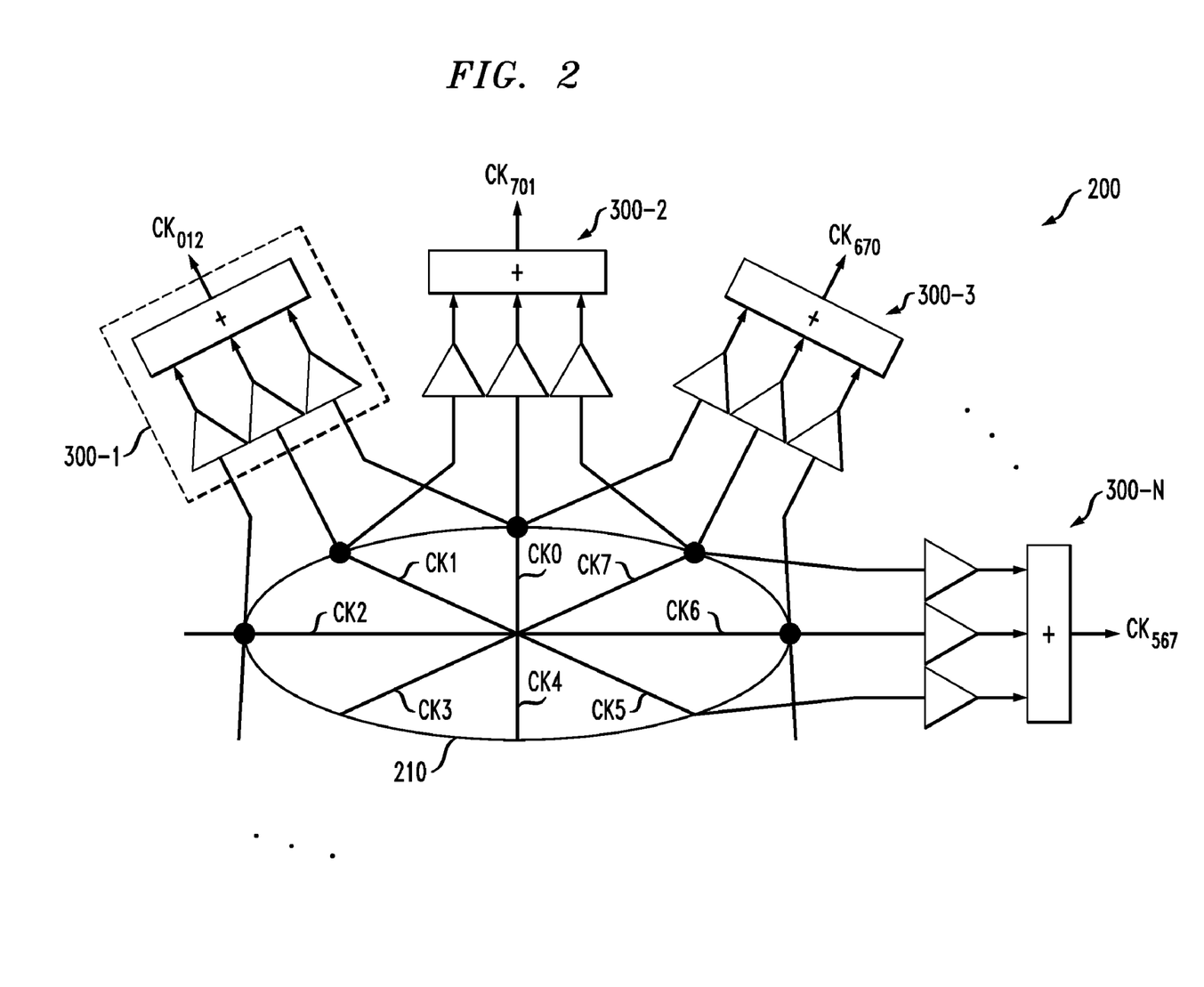
FIG. 2 is a schematic block diagram of a multi-phase clock generator incorporating features of the present invention.

FIG. 2 is a schematic block diagram of a multi-phase clock generator 200 incorporating features of the present invention. A ring oscillator, such as the ring oscillator 110 of FIG. 1, comprised of a cascaded chain of delay elements can generate the multi-phase clocks CK0-CK7. The exemplary multi-phase output clocks CK0-CK7 are connected in a network 210 such that a desired number of adjacent clocks can be phase averaged. In the exemplary embodiment shown in FIG. 2, the number of adjacent clocks that are phase averaged is three. The phase averaging is preformed for each set of three adjacent clocks at a corresponding stage 300, discussed further below in conjunction with FIG. 3.

Generally, each exemplary stage 300 comprises a buffer for each multi-phase clock being averaged, and an adder to perform the average operation on the three amplified clock signals. Each stage 300 takes three adjacent phases from the oscillator and the output clock phase is the interpolation/average of the three input phases. Among other benefits, the phase averaging reduces the phase mismatching and increases the clock amplitude. Averaging over additional phases is possible, but the phase difference between the two extreme phases should be less than 90 degrees to avoid amplitude reduction.

Figure 3:
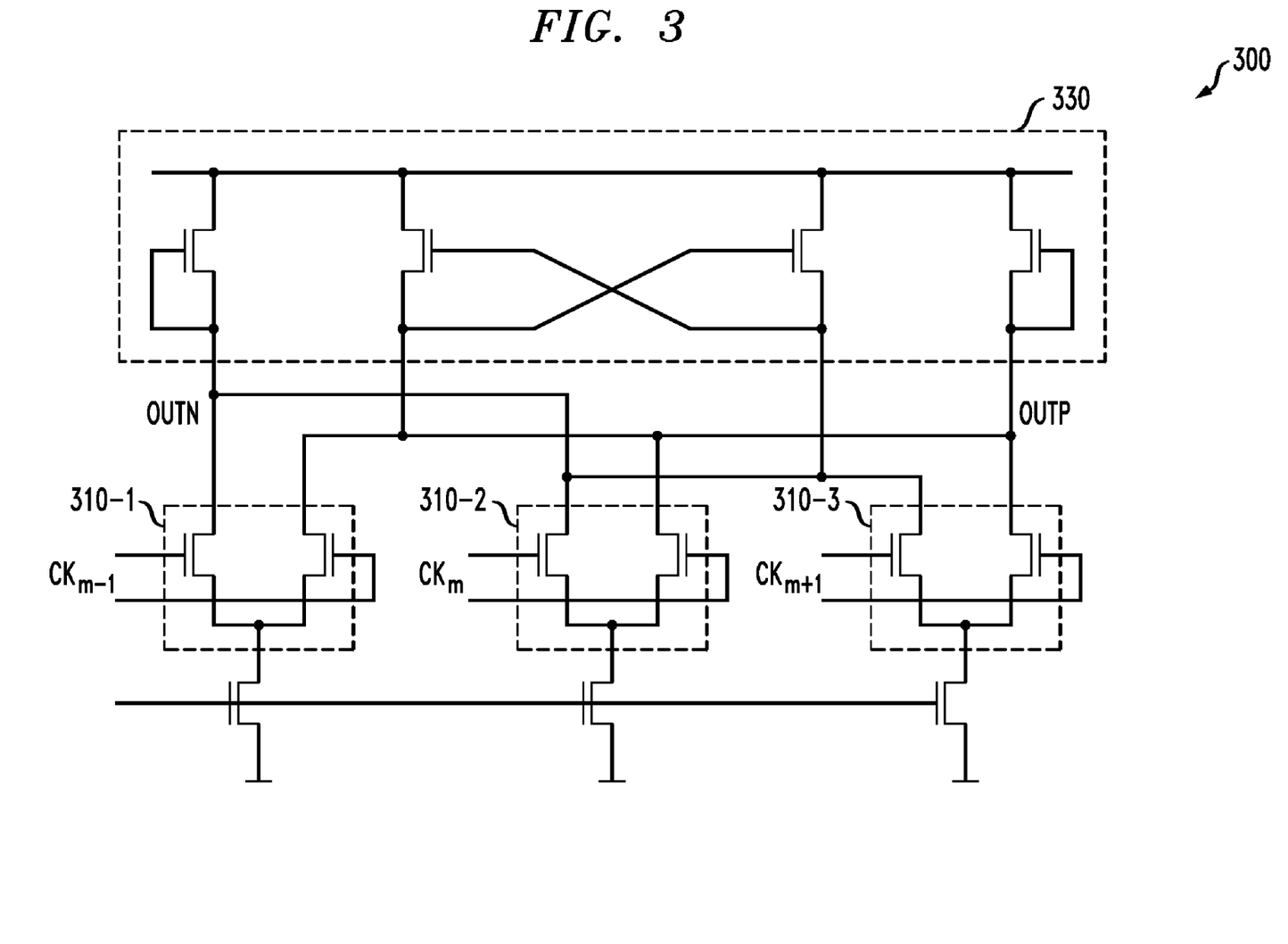
FIG. 3 is a circuit diagram of an exemplary clock processing circuit in accordance with an illustrative embodiment.

FIG. 3 is a circuit diagram of an exemplary clock processing circuit 300 in accordance with an illustrative embodiment. As shown in FIG. 3, each circuit 300 includes a differential pair circuit 310-1 through 310-3, each associated with a different multi-phase clock $CK_{m-1}$-$CK_{m+1}$ to be averaged, and a load 330. Generally, the differential pair circuits 310 should match one another and perform an amplification function. The currents generated by the differential pair circuits 310 are summed and applied to the common load 330 and is thereby converted to a voltage to achieve the averaging operation.

Generally, each exemplary clock processing circuit 300 performs clock interpolation, averaging and amplification functions. The merged structure shown in FIG. 3 allows the phase linearity to be improved while keeping the circuit complexity and power consumption at similar levels as conventional approaches.

Figure 4:
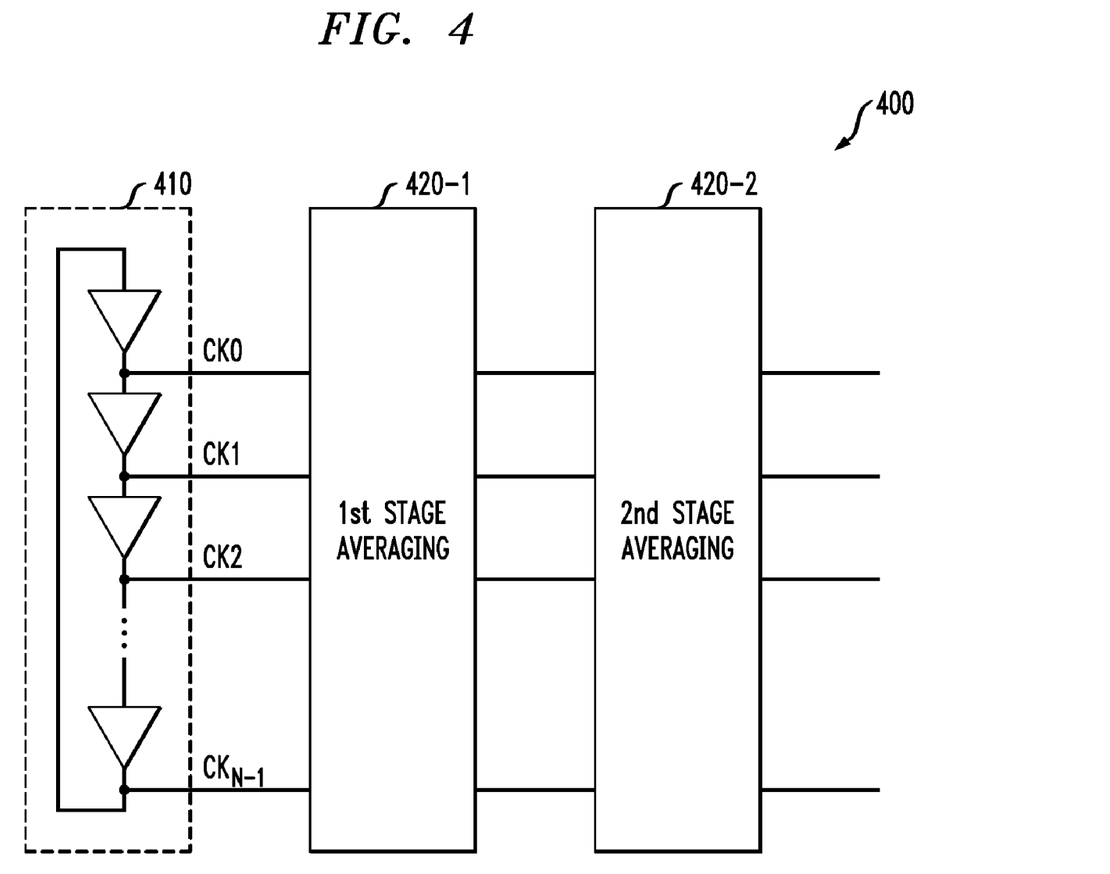
FIG. 4 is a schematic block diagram of a multi-stage, multi-phase clock generator incorporating features of the present invention.

FIG. 4 is a schematic block diagram of a multi-stage, multi-phase clock generator 400 incorporating features of the present invention. The embodiment shown in FIG. 4 recognizes that the linearity can be further improved by cascading several stages of averaging operations. As shown in FIG. 4, the multi-stage embodiment 400 includes a ring oscillator 410 and a plurality of averaging stages 420-1, 420-2. In the exemplary embodiment, there are two stages of averaging. Each averaging stage 420 can be implemented using the clock processing circuit 300 of FIG. 3.

Figure 5:
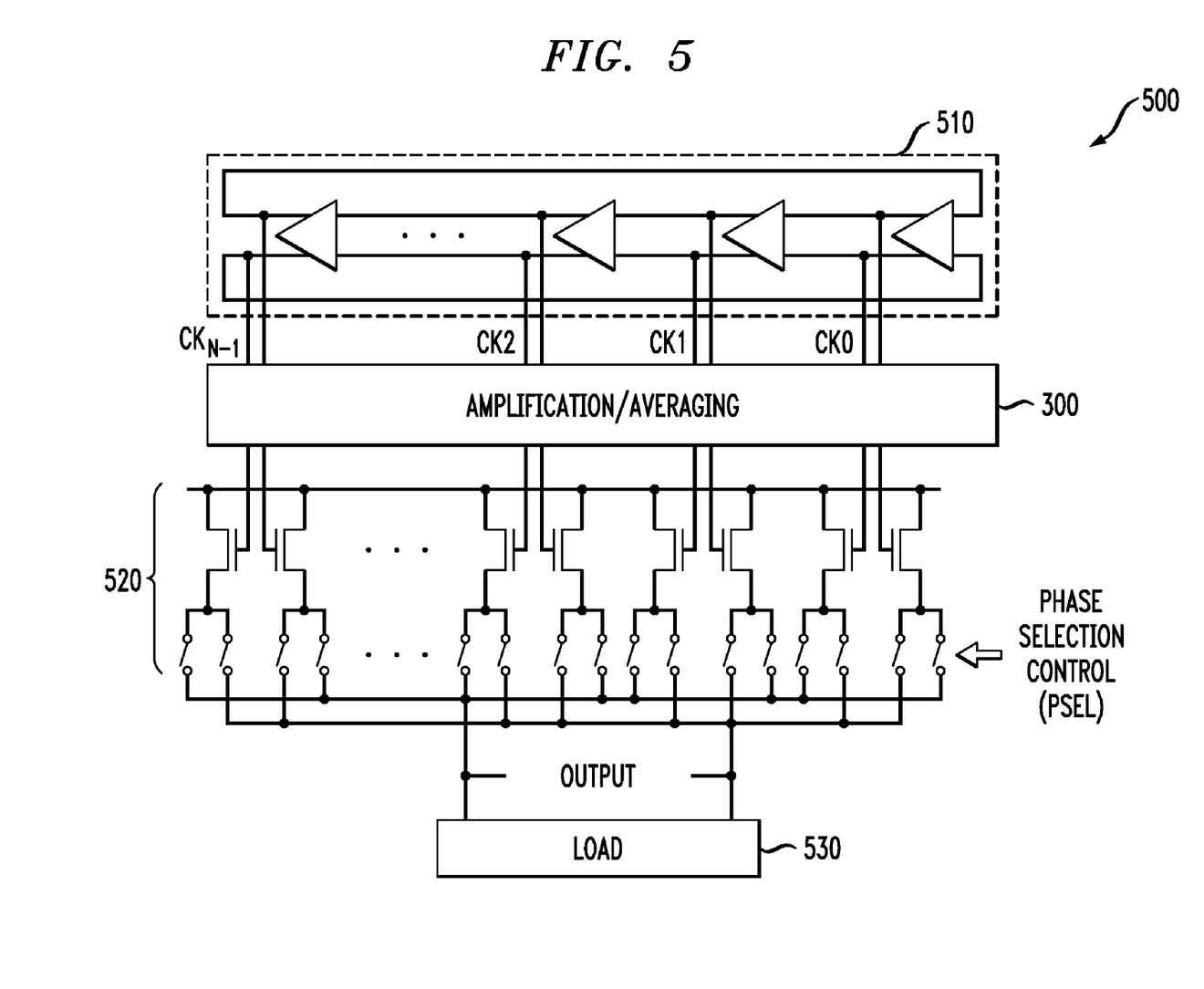
FIG. 5 is a schematic block diagram of a multi-phase clock generator in accordance with another embodiment of the present invention.

FIG. 5 is a schematic block diagram of a multi-phase clock generator 500 in accordance with another embodiment of the present invention. A ring oscillator 510 comprised of a cascaded chain of delay elements can generate the multi-phase clocks CK0-$CK_{N-1}$. The multi-phase clocks CK0-$CK_{N-1}$ are applied to an amplification/averaging circuit 300, such as the circuit discussed above in conjunction with FIG. 3.

The outputs of the amplification/averaging circuit 300 ($1^{st}$ stage phase averaging interpolation) are applied to the appropriate transistor gates in a switching network 520 to generate a current. The current is then switched on or off depending on whether the corresponding clock phase is selected. The phase selection control signal, PSEL, is generated by the clock recovery control loop.

The timing diagram of the phase selection controls is discussed below in conjunction with FIG. 6 and the relationship between the output clock phase and the phase selection control is discussed below in conjunction with FIG. 7.

Figure 6:
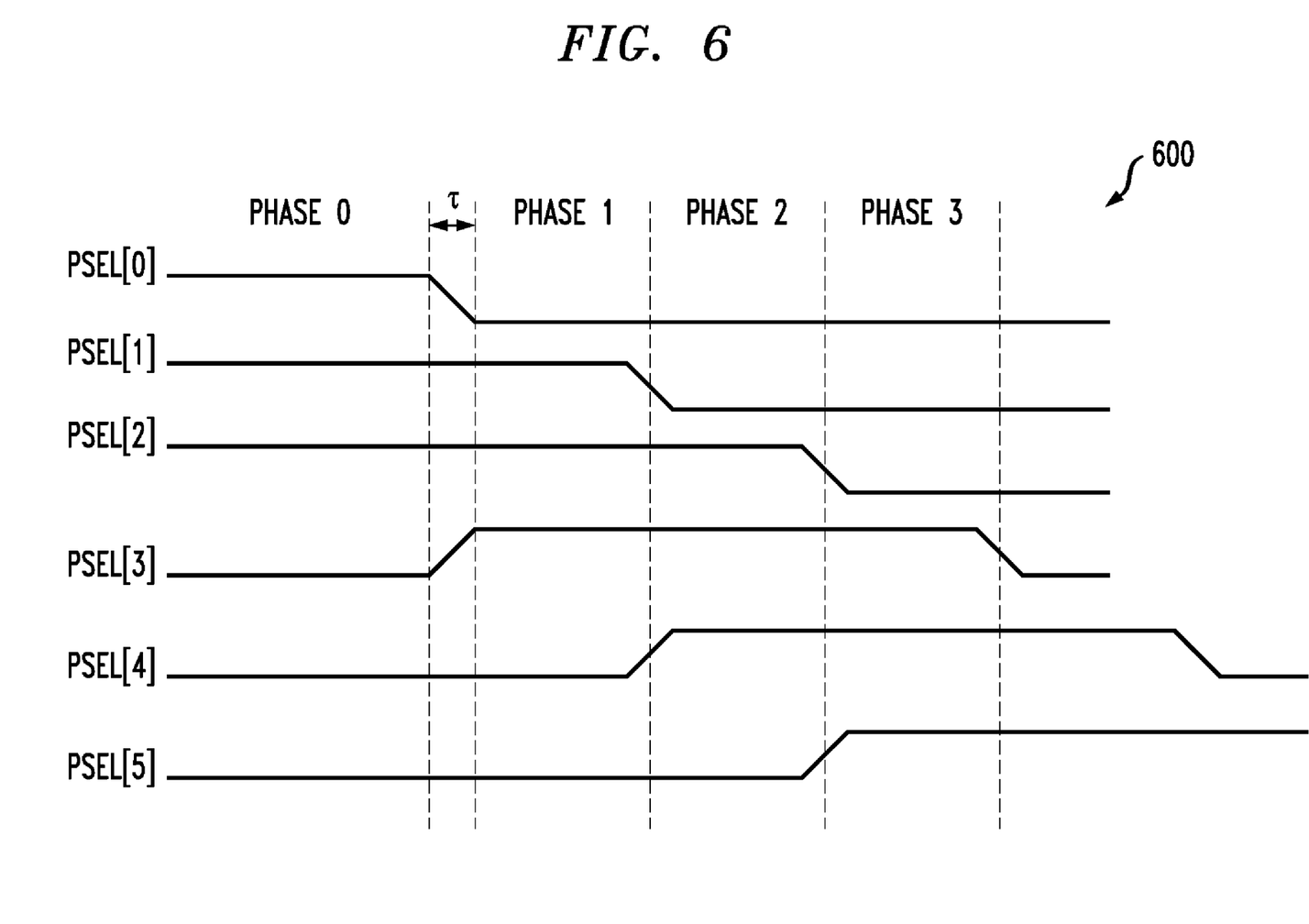
FIG. 6 illustrates the timing diagram of the phase selection controls of FIG. 5.

FIG. 6 illustrates the timing diagram of the phase selection controls of FIG. 5. As an example, if the $PSEL_{M-1}$, $PSEL_M$, $PSEL_{M+1}$ are high, the input clock phase $PI_{M-1}$, $PI_M$ and $PI_{M+1}$ are selected, and the output clock phase is the average of $PI_{M-1}$, $PI_M$ and $PI_{M+1}$. To move to the next output phase, $PSEL_{M-1}$ is switched from high to low, thus de-selecting $PI_{M-1}$; $PSEL_M$ and $PSEL_{M+1}$ remain high and $PSEL_{M+2}$ changes from low to high. Thus, the output clock phase is now the average of $PI_M$, $PI_{M+1}$ and $PI_{M+2}$. In order to reduce the phase jump during a phase change, the rise/fall time, τ, of the phase selection control PSEL is intentionally kept long compared to the clock frequency, so the phase change is partitioned over several clock periods, resulting in a gradual phase change. In this manner, during the rise/fall time, τ, both $PI_{M-1}$ and $PSEL_{M+2}$ are selected to avoid a glitch.

Figure 7:
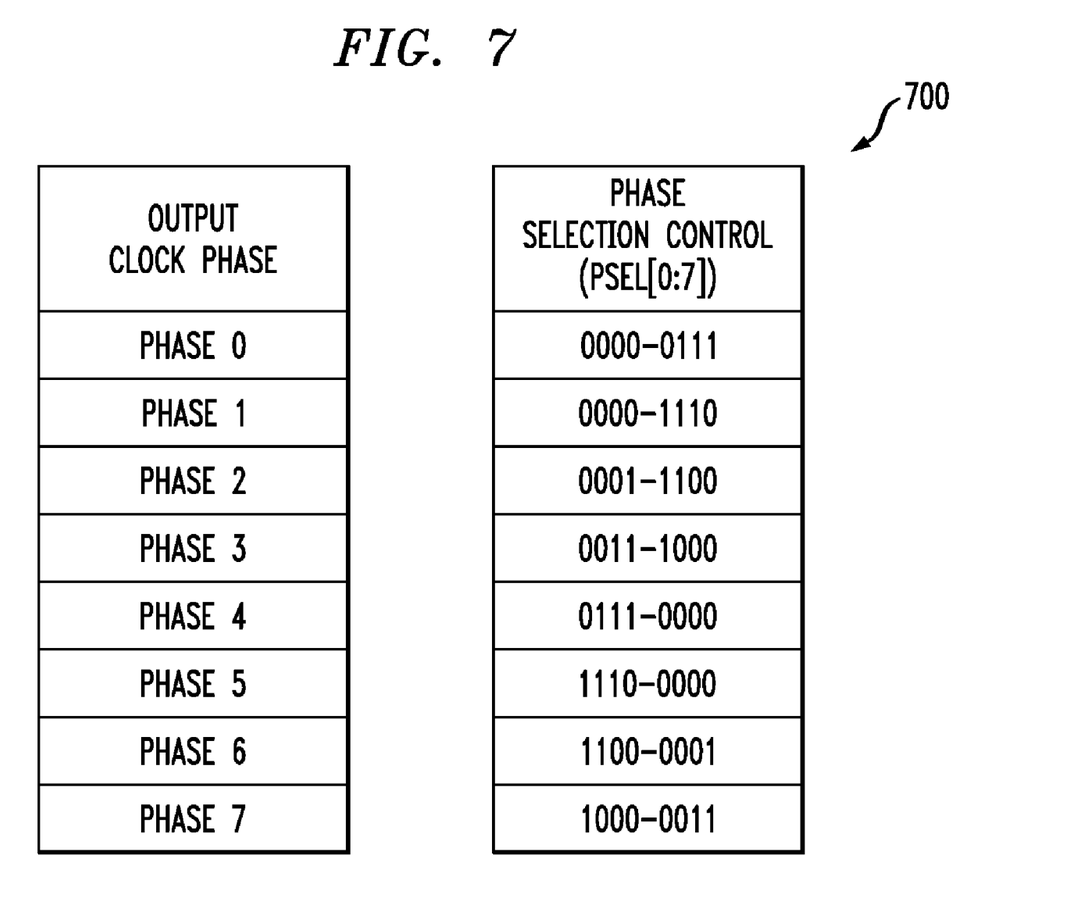
FIG. 7 illustrates the relationship between the output clock phase and the phase selection control of FIG. 5.

FIG. 7 illustrates the relationship between the output clock phase of FIG. 5 and the phase selection control, PSEL (for an exemplary 8-phase case with 3-phase averaging). As previously indicated, and shown by the phase selection control signal, three phases are selected each time (in accordance with a binary value of one in 3 adjacent phase positions). The output clock phase is the interpolation of the three selected input clock phases.

CONCLUSION

While exemplary embodiments of the present invention have been described with respect to digital logic blocks, as would be apparent to one skilled in the art various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for generating a multi-phase output clock, comprising:
    generating a plurality of clocks each having a substantially similar frequency and a different phase;
    applying each of said plurality of clocks to at least one of a plurality of corresponding amplifiers;
    summing an output of a first set of said plurality of corresponding amplifiers to generate a first phase of said multi-phase output clock; and
    summing an output of a second set of said plurality of corresponding amplifiers to generate a second phase of said multi-phase output clock.

2. The method of claim 1, wherein said generating step is performed by a ring oscillator.

3. The method of claim 1, wherein each of said corresponding amplifiers comprises a differential pair circuit.

4. The method of claim 3, wherein said summing step is performed by applying an output of said differential pair circuits to a load.

5. The method of claim 1, further comprising the step of performing a multiple-stage averaging operation.

6. The method of claim 5, wherein said multiple-stage averaging operation comprises applying said multi-phase output clock to at least a second set of corresponding amplifiers.

7. The method of claim 1, wherein a phase of said multi-phase output clock is adjusted based on a phase selection control signal.

8. The method of claim 7, wherein a rise/fall time of said phase selection control signal is longer than a frequency of said multi-phase output clock.

9. A clock generation circuit for generating a multi-phase output clock, comprising:
    a ring oscillator generating a plurality of clocks having a substantially similar frequency and different phases;
    a plurality of amplifiers, each of said amplifiers amplifying two or more of said plurality of clocks;
    a first adder for summing an output of a first set of said plurality of amplifiers to generate a first phase of said multi-phase output clock; and
    a second adder for summing an output of a second set of said plurality of amplifiers to generate a second phase of said multi-phase output clock.

10. The clock generation circuit of claim 9, wherein each of said plurality of amplifiers comprises a differential pair circuit.

11. The clock generation circuit of claim 10, wherein said adder comprises the application of an output of said differential pair circuits to a load.

12. The clock generation circuit of claim 9, further comprising a plurality of averaging stages.

13. The clock generation circuit of claim 12, wherein each of said averaging stages comprises a plurality of amplifiers.

14. The clock generation circuit of claim 9, wherein a phase of said multi-phase output clock is adjusted based on a phase selection control signal.

15. The clock generation circuit of claim 14, wherein a rise/fall time of said phase selection control signal is longer than a frequency of said multi-phase output clock.

16. An integrated circuit, comprising:
    a clock generation circuit for generating a multi-phase output clock, comprising:
    a ring oscillator generating a plurality of clocks having a substantially similar frequency and different phases;
    a plurality of amplifiers, each of said amplifiers amplifying two or more of said plurality of clocks;
    a first adder for summing an output of a first set of said plurality of amplifiers to generate a first phase of said multi-phase output clock; and
    a second adder for summing an output of a second set of said plurality of amplifiers to generate a second phase of said multi-phase output clock.

17. The integrated circuit of claim 16, wherein each of said plurality of amplifiers comprises a differential pair circuit.

18. The integrated circuit of claim 17, wherein said adder comprises the application of an output of said differential pair circuits to a load.

19. The integrated circuit of claim 16, further comprising a plurality of averaging stages.

20. The integrated circuit of claim 19, wherein each of said averaging stages comprises a plurality of amplifiers.

* * * * *

UNITED STATES PATENT AND TRADEMARK OFFICE
CERTIFICATE OF CORRECTION

PATENT NO. : 7,808,329 B2
APPLICATION NO. : 12/187701
DATED : October 5, 2010
INVENTOR(S) : Kameran Azadet It is certified that error appears in the above-identified patent and that said Letters Patent is hereby corrected as shown below:

In column 2, line 61, "$\phi_0$" should be replaced by --$\phi_1$--.

Signed and Sealed this
Twenty-fifth Day of December, 2012

David J. Kappos
*Director of the United States Patent and Trademark Office*